US011440302B2

(12) United States Patent
Leatherdale et al.

(10) Patent No.: US 11,440,302 B2
(45) Date of Patent: *Sep. 13, 2022

(54) THIN PROTECTIVE DISPLAY FILM

(71) Applicant: 3M INNOVATIVE PROPERTIES COMPANY, St. Paul, MN (US)

(72) Inventors: Catherine A. Leatherdale, Woodbury, MN (US); David Scott Thompson, West Lakeland, MN (US); Michael A. Johnson, Stillwater, MN (US); John J. Stradinger, Roseville, MN (US); Evan L Breedlove, Woodbury, MN (US); Steven D. Solomonson, Shoreview, MN (US); Joseph D. Rule, Woodbury, MN (US); Peter D. Condo, Lake Elmo, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 120 days.

This patent is subject to a terminal disclaimer.

(21) Appl. No.: 15/986,912

(22) Filed: May 23, 2018

(65) Prior Publication Data
US 2018/0264790 A1 Sep. 20, 2018

Related U.S. Application Data

(63) Continuation of application No. 14/968,993, filed on Dec. 15, 2015, now Pat. No. 10,005,264.

(51) Int. Cl.
*B32B 27/28* (2006.01)
*B32B 27/40* (2006.01)
(Continued)

(52) U.S. Cl.
CPC .............. *B32B 27/281* (2013.01); *B32B 7/06* (2013.01); *B32B 7/12* (2013.01); *B32B 27/08* (2013.01);
(Continued)

(58) Field of Classification Search
CPC ..... B32B 27/281; B32B 7/12; B32B 2255/10; B32B 2255/26; B32B 2307/412;
(Continued)

(56) References Cited

U.S. PATENT DOCUMENTS

| 4,745,152 A | 5/1988 | Fock et al. |
| 5,277,944 A | 1/1994 | Holzer et al. |

(Continued)

FOREIGN PATENT DOCUMENTS

| JP | 2013144391 | 7/2013 |
| WO | WO 03/094256 | 11/2003 |

(Continued)

OTHER PUBLICATIONS

Clift, S. M.; "Understanding the Dynamic Properties of Polyurethane Cast Elastomers", Sep. 30-Oct. 3, 1990, presented at The Society of the Plastics Industry, Inc., 33rd Annual Technical/Marketing Conference in Orlando, FL, p. 70 (Year: 1990).*

(Continued)

*Primary Examiner* — Callie E Shosho
*Assistant Examiner* — Steven A Rice

(57) ABSTRACT

A display film includes a transparent polymeric substrate layer having a 0.2% offset yield stress greater than 110 MPa and a transparent aliphatic cross-linked polyurethane layer having a thickness of 100 micrometers or less disposed on the transparent polymeric substrate layer. The transparent aliphatic cross-linked polyurethane layer has a glass transition temperature in a range from 11 to 27 degrees Celsius and a Tan Delta peak value in a range from 0.5 to 2.5. The display film has a haze value of 2% or less.

17 Claims, 2 Drawing Sheets

(51) Int. Cl.
  *B32B 27/30* (2006.01)
  *B32B 7/06* (2019.01)
  *B32B 27/08* (2006.01)
  *B32B 7/12* (2006.01)
  *H01L 51/52* (2006.01)
  *B32B 27/16* (2006.01)
  *B32B 27/34* (2006.01)
  *B32B 27/32* (2006.01)
  *B32B 27/36* (2006.01)
  *C08J 7/04* (2020.01)
  *C08J 7/043* (2020.01)
  *C08J 7/046* (2020.01)
  *C08J 7/048* (2020.01)
  *H01L 51/00* (2006.01)

(52) U.S. Cl.
  CPC ............ *B32B 27/16* (2013.01); *B32B 27/308* (2013.01); *B32B 27/325* (2013.01); *B32B 27/34* (2013.01); *B32B 27/36* (2013.01); *B32B 27/365* (2013.01); *B32B 27/40* (2013.01); *C08J 7/042* (2013.01); *C08J 7/043* (2020.01); *C08J 7/046* (2020.01); *C08J 7/048* (2020.01); *H01L 51/0097* (2013.01); *H01L 51/5253* (2013.01); *B32B 2250/03* (2013.01); *B32B 2250/24* (2013.01); *B32B 2255/10* (2013.01); *B32B 2255/26* (2013.01); *B32B 2255/28* (2013.01); *B32B 2307/40* (2013.01); *B32B 2307/412* (2013.01); *B32B 2307/50* (2013.01); *B32B 2307/536* (2013.01); *B32B 2307/54* (2013.01); *B32B 2307/546* (2013.01); *B32B 2307/584* (2013.01); *B32B 2307/72* (2013.01); *B32B 2307/7244* (2013.01); *B32B 2307/7265* (2013.01); *B32B 2307/732* (2013.01); *B32B 2307/734* (2013.01); *B32B 2307/748* (2013.01); *B32B 2457/20* (2013.01); *B32B 2457/202* (2013.01); *B32B 2457/206* (2013.01); *C08J 2379/08* (2013.01); *C08J 2475/04* (2013.01); *Y02E 10/549* (2013.01)

(58) Field of Classification Search
  CPC .......... B32B 2307/536; B32B 2307/54; B32B 2307/584; B32B 2457/206; H01L 51/0097; H01L 51/5253
  USPC ...................................................... 428/423.1
  See application file for complete search history.

(56) References Cited

U.S. PATENT DOCUMENTS

| | | | |
|---|---|---|---|
| 5,449,558 A | 9/1995 | Hasegawa et al. | |
| 5,798,409 A | 8/1998 | Ho | |
| 6,376,082 B1 | 4/2002 | Edmond et al. | |
| 7,052,762 B2 | 5/2006 | Hebrink et al. | |
| 7,980,910 B2 | 7/2011 | Padiyath et al. | |
| 8,263,731 B2 | 9/2012 | Liu et al. | |
| 8,507,632 B2 | 8/2013 | Hara et al. | |
| 8,551,279 B2 | 10/2013 | Johnson et al. | |
| 8,551,285 B2 | 10/2013 | Ho et al. | |
| 10,005,264 B2* | 6/2018 | Leatherdale | B32B 27/08 |
| 10,090,480 B2* | 10/2018 | Johnson | B32B 27/325 |
| 2003/0235704 A1 | 12/2003 | Akatsu et al. | |
| 2009/0004478 A1 | 1/2009 | Baetzold et al. | |
| 2009/0123668 A1 | 5/2009 | Hebrink et al. | |
| 2009/0189124 A1 | 7/2009 | Guiheen et al. | |
| 2011/0183120 A1 | 7/2011 | Sharygin et al. | |
| 2012/0204566 A1 | 8/2012 | Hartzell et al. | |
| 2013/0251961 A1 | 9/2013 | Johnson et al. | |
| 2013/0261209 A1 | 10/2013 | Kim et al. | |
| 2014/0088246 A1* | 3/2014 | Morikami | C08G 18/6659 524/591 |
| 2014/0232956 A1 | 8/2014 | Kwon et al. | |
| 2015/0169089 A1* | 6/2015 | Dixon | B32B 38/0004 428/137 |
| 2015/0177432 A1 | 6/2015 | Hebrink et al. | |
| 2015/0207102 A1 | 7/2015 | Jeong et al. | |
| 2015/0330597 A2 | 11/2015 | Schaffer et al. | |
| 2016/0016338 A1 | 1/2016 | Radcliffe et al. | |
| 2016/0159039 A1 | 6/2016 | Lu et al. | |
| 2016/0187663 A1 | 6/2016 | Kim et al. | |
| 2016/0218077 A1* | 7/2016 | Azuma | B32B 7/12 |
| 2017/0081488 A1 | 3/2017 | Eveson et al. | |
| 2020/0028117 A1* | 1/2020 | Eckert | B32B 27/281 |

FOREIGN PATENT DOCUMENTS

| | | | |
|---|---|---|---|
| WO | WO 2009/120548 | 10/2009 | |
| WO | WO 2011/056396 | 5/2011 | |
| WO | WO 2014/011731 | 1/2014 | |
| WO | WO-2014011731 A1 * | 1/2014 | ............... C08K 3/36 |
| WO | WO-2014022049 A1 * | 2/2014 | ............... G02B 5/22 |
| WO | WO 2014/092422 | 6/2014 | |
| WO | WO 2014/141866 | 9/2014 | |
| WO | WO 2014/197194 | 12/2014 | |
| WO | WO 2014/197368 | 12/2014 | |

OTHER PUBLICATIONS

Ionescu, Mihail; "Chemistry and Technology of Polyols for Polyurethanes", 2005, Rapra Technology Limited, p. 5 (Year: 2005).*
LibreTexts, "2.3: Step Growth and Chain Growth", Sep. 7, 2020, p. 1 (Year: 2020).*
Ni, "A review on colorless and optically transparent polyimide films: Chemistry, process and engineering applications," Journal of Industrial and Engineering Chemistry, 2015, vol. 28, pp. 16-27.
Miller, "A New Derivation of Post Gel Properties of Network Polymers," Macromolecules, 1976, vol. 9, No. 2, pp. 206-211.

* cited by examiner

THIN PROTECTIVE DISPLAY FILM

BACKGROUND

Displays and electronic devices have evolved to be curved, bent, or folded and provide new user experiences. These device architectures may include flexible organic light emitting diodes (OLEDs), plastic liquid crystal displays (LCDs) and the like, for example.

In order to realize such flexible displays and protect elements in the displays, a flexible cover sheet or flexible window film replaces a conventional glass cover sheet. This flexible cover sheet has a number of design parameters such as; high visible light transmission, low haze, excellent scratch resistance and puncture resistance, in order to protect the elements included in the display devices. In some cases the flexible cover sheet may also need to withstand thousands of folding events around a tight bend radius (about 5 mm or less) without showing visible damage. In other cases, the flexible cover sheet must be able to unfold without leaving a crease after being bent at elevated temperature and humidity.

A variety of hard coated plastic substrates have been explored. More exotic materials like hard coated colorless transparent polyimide films have also been shown to have high hardness and good scratch resistance. However many hard coated films fail to withstand folding events around a tight bend radius without showing visible damage.

SUMMARY

The present disclosure relates to a display film that can protect a display window and survive folding tests intact. The protective display film maintains optical properties of a display film while providing scratch resistance to the display. The protective display film is optically clear and includes a thin polyurethane layer disposed on a high yield substrate.

In one aspect, a display film includes a transparent polymeric substrate layer having a 0.2% offset yield stress greater than 110 MPa and a transparent aliphatic cross-linked polyurethane layer having a thickness of 100 micrometers or less disposed on the transparent polymeric substrate layer. The transparent aliphatic cross-linked polyurethane layer has a glass transition temperature in a range from 11 to 27 degrees Celsius and a Tan Delta peak value in a range from 0.5 to 2.5. The display film has a haze value of 2% or less.

In another aspect, a display film includes a transparent polymeric substrate layer having a 0.2% offset yield stress greater than 110 MPa and a transparent aliphatic cross-linked polyurethane layer having a thickness of 100 micrometers or less disposed on the transparent polymeric substrate layer. The transparent aliphatic cross-linked polyurethane layer has a glass transition temperature in a range from 11 to 28 degrees Celsius and a Tan Delta peak value in a range from 0.5 to 2.5. The display film remains intact after at least 100,000 bending cycles about a 3 mm radius.

In another aspect, an article includes an optical display and a protective film disposed on the optical display. The protective film includes a transparent polymeric substrate layer having a 0.2% offset yield stress greater than 110 MPa and a transparent aliphatic cross-linked polyurethane layer having a thickness of 100 micrometers or less disposed on the transparent polymeric substrate layer. An optical adhesive layer fixes the transparent polymeric substrate layer to the optical display. The transparent aliphatic cross-linked polyurethane layer has a glass transition temperature in a range from 11 to 28 degrees Celsius and a Tan Delta peak value in a range from 0.5 to 2.5 and a cross-link density in a range from 0.34 to 0.65 mol/kg. The display film has a haze value of 2% or less.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

DETAILED DESCRIPTION

Figure 1:
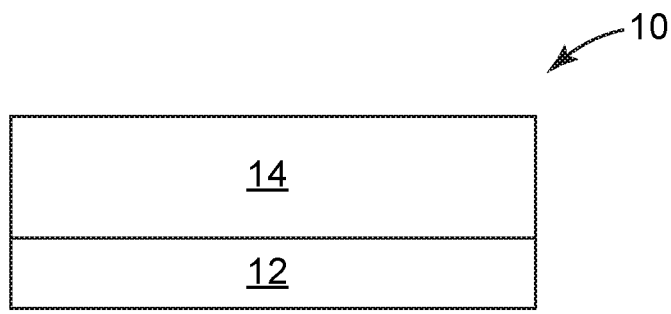
FIG. 1 is a schematic diagram side elevation view of an illustrative display film.

In the following detailed description, reference is made to the accompanying drawings that form a part hereof, and in which are shown by way of illustration several specific embodiments. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising," and the like.

The terms "display film", "protective film", and "protective display film" are herein used interchangeably.

"Transparent substrate" or "transparent layer" refers to a substrate or layer that has a high light transmission (typically greater than 90%) over at least a portion of the surface of the substrate over at least a portion of the light spectrum with wavelengths of about 350 to about 1600 nanometers, including the visible light spectrum (wavelengths of about 380 to about 750 nanometers).

"Polyurethane" refers to polymers prepared by the step-growth polymerization of hydroxyl-functional materials (materials containing hydroxyl groups —OH) with isocyanate-functional materials (materials containing isocyanate groups —NCO) and therefore contain urethane linkages (—O(CO)—NH—), where (CO) refers to a carbonyl group (C=O). The term may include "polyurethane-ureas" in which both urethane linkages and urea linkages are present.

The present disclosure relates to a display film that can protect a display window and survive folding tests intact. The protective display film maintains optical properties of a display film while providing scratch resistance to the display. The protective display film is optically clear and includes a thin polyurethane layer disposed on a high yield substrate. The high yield substrate improves the recovery properties of the display film and enables the use of a thinner polyurethane layer as compare to lower yield substrates. For a given polyurethane thickness, the ability to recover from scratches and dents is improved when the polyurethane is disposed on a high yield substrate as compared to a lower yield substrate. The overall thickness of the display film may be less than 250 micrometers, or less than 200 micrometers. The thickness of the polyurethane layer may be less than 100 micrometers. The high yield substrate may have a 0.2% offset yield stress that is greater than 110 MPa or greater than 130 MPa or greater than 150 MPa. The protective display film is formed of an aliphatic cross-linked polyurethane material that is transparent. The protective display film exhibits a haze value of 2% or less or 1.5% or less or 1% or less or 0.5% or less. The protective display film exhibits a visible light transmission of 85% or greater or 90% or greater, or 93% or greater. The protective display film exhibits a clarity of 98% or greater, or 99% or greater. The aliphatic cross-linked polyurethane material may have a glass transition temperature in a range from 11 to 27 degrees Celsius or from 17 to 22 degrees Celsius. The aliphatic cross-linked polyurethane material may have a Tan Delta peak value in a range from 0.5 to 2.5 or from 1 to 2 or from 1.4 to 1.8. The aliphatic cross-linked polyurethane material may have a cross-link density in a range from 0.34 to 0.65 mol/kg. The protective display film exhibits a room temperature scratch resistance or recovery and is able to withstand at least 100,000 folding cycles without failure or visible defects. These protective display film can withstand a bend radius of 3 mm or less, or 4 mm or less, or 3 mm or less, or 2 mm or less, or even 1 mm or less without failure or visible defects, such as delamination, cracking, or haze. While the present disclosure is not so limited, an appreciation of various aspects of the disclosure will be gained through a discussion of the examples provided below.

FIG. 1 is a schematic diagram side elevation view of an illustrative display film 10. The display film 10 includes a transparent polymeric substrate layer 12 and a transparent aliphatic cross-linked polyurethane layer 14 disposed on the transparent polymeric substrate layer 12. The display film 10 may be optically transparent, exhibit scratch recovery and is able to withstand at least 100,000 folding cycles without failure or degrading the optical properties of the display film.

The display film 10 may not be tacky and exhibit a storage modulus at 0 degree Celsius of 1 GPa or greater.

The display film 10 includes a transparent polymeric substrate layer 12 and a transparent aliphatic cross-linked polyurethane layer 14 disposed on the transparent polymeric substrate layer 12. The transparent polymeric substrate layer 12 may be referred to as a "high yield" substrate and may have a 0.2% offset yield stress value that is greater than 110 MPa or greater than 130 MPa or greater than 150 MPa. The transparent aliphatic cross-linked polyurethane layer 14 may have a thickness of 100 micrometers or less, or 80 micrometers or less, or 60 micrometers or less. The transparent aliphatic cross-linked polyurethane layer 14 may have a thickness in a range from 10 to 100 micrometers, or 30 to 80 micrometers, or 40 to 60 micrometers.

The transparent aliphatic cross-linked polyurethane layer 14 may have a glass transition temperature in a range from 11 to 27 degrees Celsius or from 17 to 22 degrees Celsius. The phrase "glass transition temperature" refers herein to the "on-set" glass transition temperature by DSC and is measured according to ASTM E1256-08 2014.

The transparent aliphatic cross-linked polyurethane layer 14 may have a Tan Delta peak value in a range from 0.5 to 2.5, or from 1 to 2, or from 1.4 to 1.8. Tan Delta peak value and peak temperature is measured according to the DMA analysis described in the Examples. The transparent aliphatic cross-linked polyurethane layer 14 may have a cross-link density in a range from 0.34 to 0.65 mol/kg.

The display film 10 may have a haze value of 2% or less, or 1.5% or less, or 1% or less, or 0.5% or less. In some embodiments the display film 10 may have a haze value of 5% or less. The display film 10 may have a clarity of 98% or greater, or 99% or greater. The display film 10 may have a visible light transmission of 85% or greater, or 90% or greater, or 93% or greater.

The display film 10 may have a yellow index or b* value of 5 or less, or 4 or less, or 3 or less, or 2 or less, or 1 or less. In many embodiments the display film 10 may have a yellow index or b* value of 1 or less.

The display film 10 may maintain a haze value of 2% or less, or 1.5% or less, or 1% or less after at least 100,000 bending or folding cycles about a 3 mm radius. The display film 10 may maintain a stable haze value, or remain intact without cracking or delaminating, after at least 100,000 bending or folding cycles about a 5 mm radius, or about a 4 mm radius, or about a 3 mm radius, or about a 2 mm radius, or about a 1 mm radius. The display film 10 may remain intact after at least 100,000 bending or folding cycles about a 3 mm radius or less.

The display film 10 may have any useful thickness. In many embodiments the display film 10 has a thickness of 250 micrometers or less, or 200 micrometers or less, or 150 micrometers or less, or 125 micrometers or less. The thickness of the display film 10 is a balance between being thick enough to provide the desired display protection and thin enough to provide the folding and reduced thickness design parameters.

The transparent polymeric substrate layer 12 may have any useful thickness. In many embodiments the transparent polymeric substrate layer 12 has a thickness in a range from 10 to 100 micrometers or from 20 to 80 micrometers.

The transparent polymeric substrate layer 12 may be formed of any useful polymeric material that provides the desired mechanical properties (such as dimensional stability) and optical properties (such as light transmission and clarity) to the display film 10. Examples of materials suitable for use in the polymeric substrate layer 12 include polymethylmethacrylate, polycarbonate, polyamides, polyimides, polyesters (PET, PEN), polycyclic olefin polymers and thermoplastic polyurethanes.

One useful polymeric material for forming the transparent polymeric substrate layer 12 is polyimide. In many embodiments the polyimide substrate layer is colorless. Colorless polyimide can be formed via chemistry or via nanoparticle incorporation. Some exemplary colorless polyimides formed via chemistry are described in WO 2014/092422. Some exemplary colorless polyimides formed via nanoparticle incorporation are described in Journal of Industrial and Engineering Chemistry 28 (2015) 16-27.

The transparent polymeric substrate layer 12 may have any useful tensile modulus or offset yield stress value. The transparent polymeric substrate layer 12 may be referred to as a "high yield" substrate and may have an offset yield stress value that is greater than 110 MPa, or greater than 130 MPa, or greater than 150 MPa, or greater than 180 MPa, or greater than 200 MPa. The phrase "yield stress" or "offset yield stress" refers herein to "0.2% offset yield strength" as defined in ASTM D638-14. ASTM D638-14 section A2.6 defines the test method for "offset yield strength" and is defined as the stress at which the strain exceeds by a specified amount (the offset) an extension of the initial proportional portion of the stress-strain curve. It is expressed in force per unit area, usually megapascals (poundsforce per square inch).

The transparent aliphatic cross-linked polyurethane layer 14 may have any useful thickness. The transparent aliphatic cross-linked polyurethane layer 14 may have a thickness of 100 micrometers or less, or 80 micrometers or less, or 60 micrometers or less. The transparent aliphatic cross-linked polyurethane layer 14 may have a thickness in a range from 10 to 100 micrometers, or 30 to 80 micrometers, or 40 to 60 micrometers. The thickness of the transparent aliphatic cross-linked polyurethane layer 14 is a balance between being thick enough to provide the desired protection to the display and particularly to the transparent polymeric substrate layer 12 and thin enough to provide the folding and reduced thickness design parameters.

The transparent aliphatic cross-linked polyurethane layer 14 may be coated onto the transparent polymeric substrate layer 12 (that may be primed) and then be cured or cross-linked to form a thermoset polyurethane layer 14. Polyurethane is a polymer composed of organic units joined by carbamate (urethane) links. The polyurethanes described herein are thermosetting polymers that do not melt when heated. Polyurethane polymers may be formed by reacting a di- or polyisocyanate with a polyol. Both the isocyanates and polyols used to make polyurethanes contain on average two or more functional groups per molecule. The polyurethanes described herein may have a functionality greater than 2.4 or 2.5.

A wide variety of polyols may be used to from the aliphatic cross-linked polyurethane layer. The term polyol includes hydroxyl-functional materials that generally include at least 2 terminal hydroxyl groups. Polyols include diols (materials with 2 terminal hydroxyl groups) and higher polyols such as triols (materials with 3 terminal hydroxyl groups), tetraols (materials with 4 terminal hydroxyl groups), and the like. Typically the reaction mixture contains at least some diol and may also contain higher polyols. Higher polyols are particularly useful for forming cross-linked polyurethane polymers. Diols may be generally described by the structure HO—B—OH, where the B group may be an aliphatic group, an aromatic group, or a group containing a combination of aromatic and aliphatic groups, and may contain a variety of linkages or functional groups, including additional terminal hydroxyl groups.

Polyester polyols are particularly useful. Among the useful polyester polyols useful are linear and non-linear polyester polyols including, for example, polyethylene adipate, polybutylene succinate, polyhexamethylene sebacate, polyhexamethylene dodecanedioate, polyneopentyl adipate, polypropylene adipate, polycyclohexanedimethyl adipate, and poly ε-caprolactone. Particularly useful are aliphatic polyester polyols available from King Industries, Norwalk, Conn., under the trade name "K-FLEX" such as K-FLEX 188 or K-FLEX A308.

A wide variety of polyisocyanates may be used to from the aliphatic cross-linked polyurethane layer. The term polyisocyanate includes isocyanate-functional materials that generally include at least 2 terminal isocyanate groups. Polyisocyanates include diisocyanates (materials with 2 terminal isocyanate groups) and higher polyisocyanates such as triisocyanates (materials with 3 terminal isocyanate groups), tetraisocyanates (materials with 4 terminal isocyanate groups), and the like. Typically the reaction mixture contains at least one higher isocyanate if a difunctional polyol is used. Higher isocyanates are particularly useful for forming crosslinked polyurethane polymers. Diisocyanates may be generally described by the structure OCN—Z—NCO, where the Z group may be an aliphatic group, an aromatic group, or a group containing a combination of aromatic and aliphatic groups.

Higher functional polyisocyanates are particularly useful, such as triisocyanates, to form a crosslinked polyurethane polymer layer. Triisocyanates include, but are not limited to, polyfunctional isocyanates, such as those produced from biurets, isocyanurates, adducts, and the like. Some commercially available polyisocyanates include portions of the DESMODUR and MONDUR series from Bayer Corporation, Pittsburgh, Pa., and the PAPI series from Dow Plastics, a business group of the Dow Chemical Company, Midland, Mich. Particularly useful triisocyanates include those available from Bayer Corporation under the trade designations DESMODUR N3300A and MONDUR 489. One particularly suitable aliphatic polyisocyanate is DESMODUR N3300A.

The reactive mixture used to form the transparent aliphatic cross-linked polyurethane layer 14 also contains a catalyst. The catalyst facilitates the step-growth reaction between the polyol and the polyisocyanate. Conventional catalysts generally recognized for use in the polymerization of urethanes may be suitable for use with the present disclosure. For example, aluminum-based, bismuth-based, tin-based, vanadium-based, zinc-based, or zirconium-based catalysts may be used. Tin-based catalysts are particularly useful. Tin-based catalysts have been found to significantly reduce the amount of outgassing present in the polyurethane. Most desirable are dibutyltin compounds, such as dibutyltin diacetate, dibutyltin dilaurate, dibutyltin diacetylacetonate, dibutyltin dimercaptide, dibutyltin dioctoate, dibutyltin dimaleate, dibutyltin acetonylacetonate, and dibutyltin oxide. In particular, the dibutyltin dilaurate catalyst DABCO T-12, commercially available from Air Products and Chemicals, Inc., Allentown, Pa. is particularly suitable. The catalyst is generally included at levels of at least 200 ppm or even 300 ppm or greater.

Figure 2:
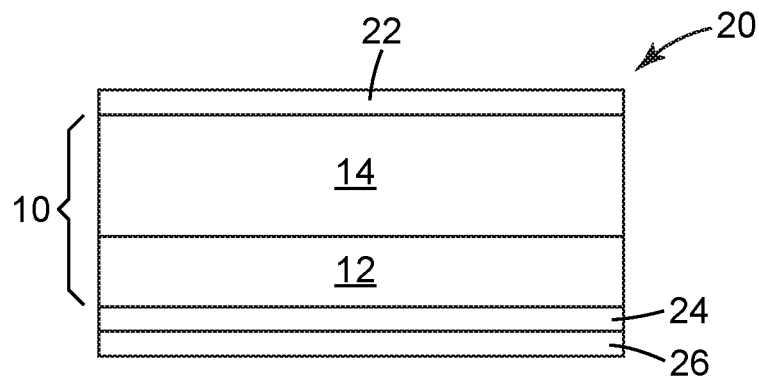
FIG. 2 is a schematic diagram side elevation view of another illustrative display film.

FIG. 2 is a schematic diagram side elevation view of another illustrative display film 20. The display film 20 may include a removable liner 22 disposed on the transparent polymeric substrate layer 12 or the transparent aliphatic cross-linked polyurethane layer 14.

The display film 20 may include an optical adhesive layer 24 disposed on the transparent polymeric substrate layer 12 and a removable liner 26 disposed on the optical adhesive layer 24 and a second removable liner 22 disposed on the transparent aliphatic cross-linked polyurethane layer 14. The optical adhesive layer may include acrylate or silicone based optical adhesives.

The transparent polymeric substrate layer 12 may be primed or treated to impart some desired property to one or more of its surfaces. In particular the transparent polymeric substrate layer 12 can be primed to improve adhesion of the transparent aliphatic cross-linked polyurethane layer 14 with the transparent polymeric substrate layer 12. Examples of such treatments include corona, flame, plasma and chemical treatments such as, acrylate or silane treatments.

The removable liners 22, 26 may provide transport protection to the underlying display film 10 and optional optical adhesive layer 24. The removable liners 22, 26 may be layer or film that has a low surface energy to allow clean removal of the liner 22, 26 from the display film 10 and optional optical adhesive layer 24. The removable liners 22, 26 may be a layer of polyester coated with a silicone, for example.

The removable liner 26 may provide temporary structure to the optional optical adhesive layer 24. For example, WO2014/197194 and WO2014/197368 describe removable liners that emboss an optical adhesive layer where the optical adhesive losses its structures once the removable liner is stripped away from the optical adhesive layer.

The display film 20 can includes one or more additional layers on or between the transparent polymeric substrate layer 12 and the transparent aliphatic cross-linked polyurethane layer 14. These optional layers may include a hardcoat layer (thickness of 6 micrometers or less), a transparent barrier layer (thickness from 3 to 200 nanometers), a microstructure layer, an anti-glare layer, anti-reflective layer, or an anti-fingerprint layer.

The hardcoat layer may be disposed on either side of one or both of the transparent polymeric substrate layer 12 and the transparent aliphatic cross-linked polyurethane layer 14. The hardcoat layer may include a multi-functional acrylate resins with at least 30% wt nanosilica particles. WO2014/011731 describes some exemplary hardcoats.

The transparent barrier layer may be disposed on either side of one or both of the transparent polymeric substrate layer 12 and the transparent aliphatic cross-linked polyurethane layer 14. The transparent barrier layer can mitigate or slow ingress of oxygen or water through the display film 10. Transparent barrier layers may include for example, thin alternating layers of silica, alumina or zirconia together with an organic resin. Exemplary transparent barrier layer are described in are described in U.S. Pat. No. 7,980,910 and WO2003/094256.

The microstructure layer may be disposed on either side of one or both of the transparent polymeric substrate layer 12 and the transparent aliphatic cross-linked polyurethane layer 14. The microstructure layer may improve the optical properties of the display film 10. An exemplary microstructure layer is described in U.S. Ser. No. 14/335,236 filed 18 Jul. 2014 and entitled "Multilayer Optical Adhesives and Method of Making the Same".

Figure 3:
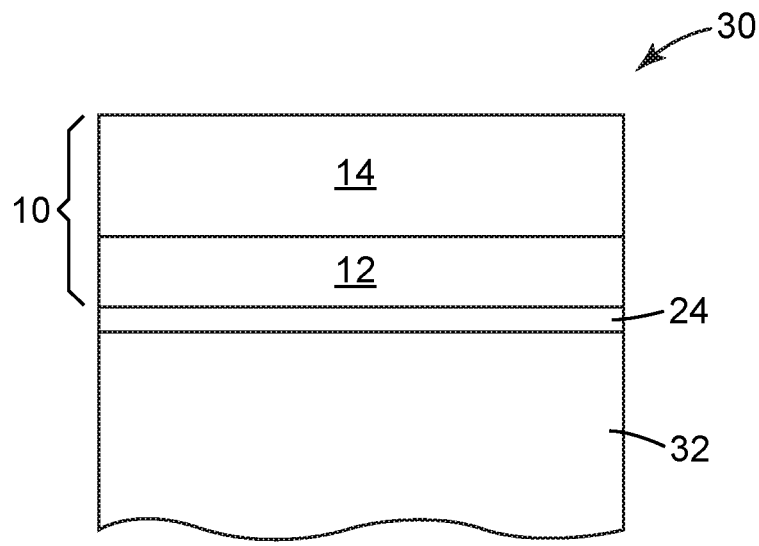
FIG. 3 is a schematic diagram side elevation view of an illustrative display film on an article.
Figure 4:
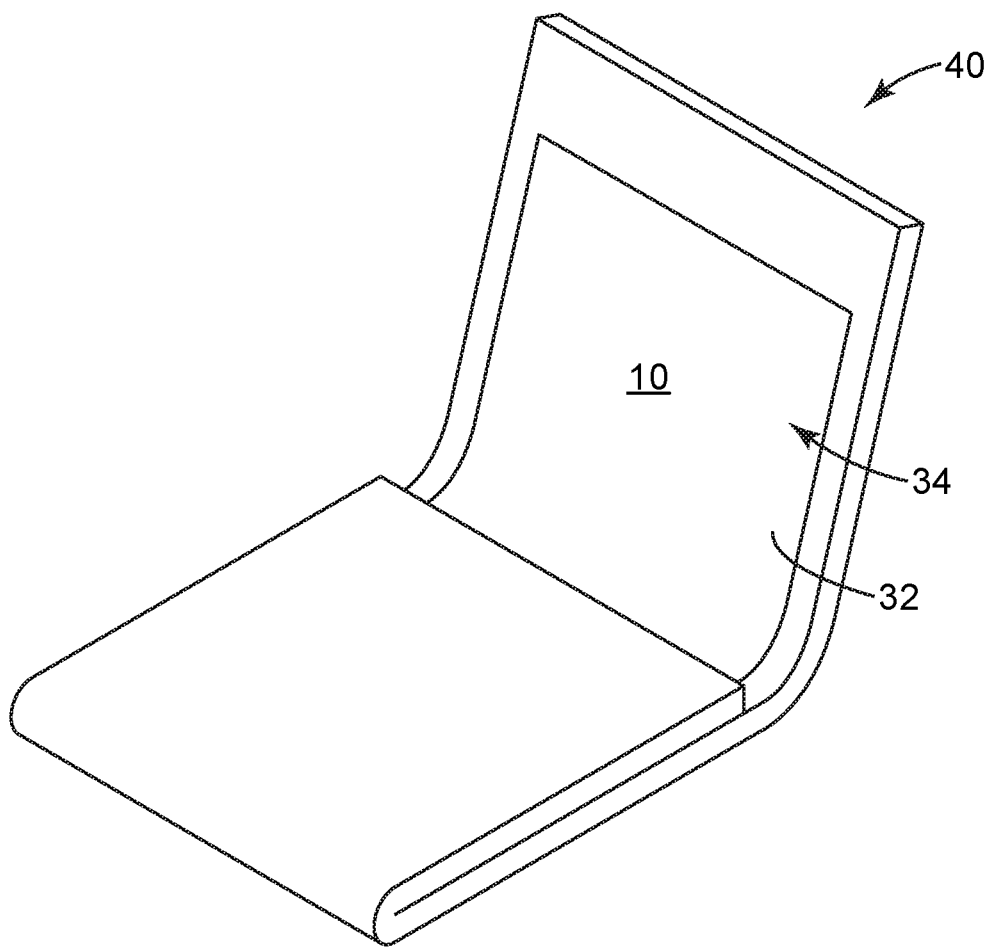
FIG. 4 is a schematic diagram perspective view of an illustrative folding article including an illustrative display film.

FIG. 3 is a schematic diagram side elevation view of an illustrative display film 10 on an article 30. FIG. 4 is a schematic diagram perspective view of an illustrative folding article 40 including an illustrative display film 10.

The article 30 includes an optical layer 32 and a display film 10 disposed on the optical layer 32. The display film 10 includes a transparent polymeric substrate layer 12 and a transparent aliphatic cross-linked polyurethane layer 14 disposed on the transparent polymeric substrate layer 12, as described above. An optical adhesive layer 24 fixes the transparent polymeric substrate layer 12 to the optical layer 32. In some cases the optical adhesive permanently fixes the display film to the article or optical layer. In other cases the display film and optical adhesive can be removed/debonded/repositioned, relative to the optical layer or article, with the application of heat or mechanical force such that the display film is replaceable or repositionable by the consumer.

The optical layer 32 may form at least a portion of an optical element. The optical element may be display window or element of a display device, such as an optical display 34. The display device 40 can be any useful article such as a phone or smartphone, electronic tablet, electronic notebook, computer, and the like. The optical display may include an organic light emitting diode (OLED) display panel. The optical display may include a liquid crystal display (LCD) panel or a reflective display. Examples of reflective displays include electrophoretic displays, electrofluidic displays (such as an electrowetting display), interferometric displays or electronic paper display panels, and are described in US 2015/0330597.

Further examples of optical displays include static display such as commercial graphic signs and billboards.

The display film 10 and the attached optical layer 32 or optical element or optical display 34 may be foldable so that the optical display 34 faces itself and at least a portion of display film 10 contacts another portion of the protective film 10, as illustrated in FIG. 4. The display film 10 and the attached optical layer 32 or optical element or optical display 34 may be flexible or bendable or foldable so that a portion of the display film 10 and the attached optical layer 32 or optical element or optical display 34 can articulate relative to another portion of the display film 10 and the attached optical layer 32 or optical element or optical display 34. The display film 10 and the attached optical layer 32 or optical element or optical display 34 may be flexible or bendable or foldable so that a portion of the display film 10 and the attached optical layer 32 or optical element or optical display 34 can articulate at least 90 degrees or at least 170 degrees relative to another portion of the display film 10 and the attached optical layer 32 or optical element or optical display 34.

The display film 10 and the attached optical layer 32 or optical element or optical display 34 may be flexible or bendable or foldable so that a portion of the display film 10 and the attached optical layer 32 or optical element or optical display 34 can articulate relative to another portion of the display film 10 and the attached optical layer 32 or optical element or optical display 34 to form a bend radius of 3 mm or less in the display film 10 at the bend or fold line. The display film 10 and the attached optical layer 32 or optical element or optical display 34 may be flexible or bendable or foldable so that a portion of the display film 10 and the attached optical layer 32 or optical element or optical display 34 can articulate relative to another portion of the display film 10 and the attached optical layer 32 or optical element or optical display 34 to form a bend radius such that the display film 10 overlaps itself and is separated from each other by a distance on 10 mm or less, or 6 mm or less or 3 mm or less or contacts each other.

In one embodiment, the display film (having a thickness in a range from 100 to 150 micrometers) includes a transparent polymeric substrate layer (having a thickness in a range from 50 to 75 micrometers) and a transparent aliphatic cross-linked polyurethane layer (having a thickness in a range from 25 to 75 micrometers) disposed on the transparent polymeric substrate layer. The transparent polymeric substrate layer has a 0.2% offset yield stress value that is 150 MPa or greater. The transparent aliphatic cross-linked polyurethane layer may have a glass transition temperature in a range from 17 to 22 degrees Celsius, a Tan Delta peak value in a range from 1.4 to 1.8 and a b* value less than 2.5. The display film has a haze value of 1% or less and a visible light transmission of 88% or greater.

Objects and advantages of this disclosure are further illustrated by the following examples, but the particular materials and amounts thereof recited in these examples, as well as other conditions and details, should not be construed to unduly limit this disclosure.

Examples

All parts, percentages, ratios, etc. in the examples are by weight, unless noted otherwise. Solvents and other reagents used were obtained from Sigma-Aldrich Corp., St. Louis, Mo. unless specified differently.

Model Examples

Abaqus finite element modeling software (Dassault Systems, Velizy-Villacodlay, France) was used to study the effect of coating properties and substrate yield stress on the size of the plastic deformation zone as a function on normal load. The scratch implement was modeled as a 1 mm diameter, rigid ball. Mechanical properties of the substrate and thickness of the coating were as shown in Table 1. Both were modeled as elastic-plastic materials. AxiSymmetric modeling technique was used for the analysis. The display film was modeled as lying on top a rigid support with no friction between the substrate and the rigid support. In all cases the coating was modeled as an elastic-plastic material with modulus equal to 900 MPa and yield stress equal to 24 MPa.

The size of the plastic deformation zone for each case was defined as the radius of the zone where the Von Mises stress exceeded the substrate yield stress measured at the depth where the substrate met the rigid support. If the Von Mises stress at this depth was less the yield stress of the polymer substrate, then the plastic deformation zone size was recorded as being equal to zero.

TABLE 1

Finite Element Analysis Results

| Case | Normal Load (N) | Substrate Modulus (GPa) | Substrate Yield Stress (MPa) | Coating Thickness (um) | Plastic Deformation Zone Size (mm)* |
|---|---|---|---|---|---|
| 1 | 10 | 4.7 | 144 | 30 | 0.106 |
| 2 | 10 | 6.0 | 170 | 30 | 0.073 |
| 3 | 10 | 7.4 | 200 | 30 | 0.04 |
| 4 | 10 | 8.2 | 230 | 30 | 0 |
| 5 | 14 | 4.7 | 144 | 50 | 0.11 |
| 6 | 14 | 6.0 | 170 | 50 | 0.087 |
| 7 | 14 | 7.4 | 200 | 50 | 0.042 |
| 8 | 14 | 8.2 | 230 | 50 | 0 |

The results in Table 1 show that as the substrate yield stress increases, the size of the plastic deformation zone associated with a visible dent decreases. The same trend is seen for both 10 N and 14 N normal loads.

Working Examples

A series of aliphatic cross-linked polyurethane were coated on transparent polymer substrates. The scratch resistance, scratch recovery rate, flexibility, and dynamic folding performance were all characterized as described below.

TABLE 2

Materials

| Abbreviation or Trade Designation | Description |
|---|---|
| K-FLEX 188 | Aliphatic polyester polyol, commercially available from King Industries, Norwalk, CT under the trade name "K-FLEX 188" |
| DESMODUR N3300A | Aliphatic polyisocyanate, commercially available from Bayer, Pittsburgh, PA under the trade name "DESMODUR N3300A". |
| DABCO T-12 | Dibutyltin dilaurate catalyst, commercially available from Air Products and Chemicals, Inc., Allentown, PA, under the trade name "DABCO T-12". |
| LmPEN | 50 and 75 micron thick low melt polyethylene naphthalate polymer co-polyester made from 90% NDC (dimethyl-2,6-naphthalenedicarboxylate) and 10% terephthalic acid, extruded and bi-axially oriented as described below. |
| COP | Cyclo-Olefin Polymer (COP) film, trade name ZEONEX from Zeon Corporation, Tokyo Japan. |
| Upilex 50s | 50 um heat treated polyimide film, available from UBE America. |

Preparation of Primed LmPEN Film

A 90/10 PEN copolymer was prepared as illustrated in Example Control B of U.S. Pat. No. 8,263,731. This material was melt extruded using a twin screw extruder with vacuum applied for moisture removal. The melt was heated to 525° F. and delivered to an extrusion die and quenched on a chilled drum. This quenched film was stretched 3.3-1 at a temperature of 235-250° F. in the machine direction and cooled. This machine direction stretched film was fed to a tenter machine which gripped the film edges, heated the film back to 255-300° F. and stretched the film 3.7-1 up to 4.1-1 in the transverse direction. The film was then annealed at 450° F. for 8 to 30 sec in the same tenter. The film edges were trimmed off and a polyethylene premask applied before the film was wound into roll form.

A primer solution was made by mixing 52.5 grams of VITEL 2200B (Bostik Americas, Wauwatosa, Wis.) in 2447.5 grams of methyl ethyl ketone (Fisher Scientific) to make a homogeneous solution. The primer solution was applied to 50 micrometer thick corona treated LmPEN films in a roll to roll process where the primer solution was metered through a slot die onto the moving web. Thickness was controlled by the use of a metering pump and a mass flow meter. The volatile components of the coating were then dried in a 3 zone air floatation zone oven (ovens temperatures set all set to 175° F.). The dried coating was then wound into a roll and the primer coating had a thickness of approximately 81 nanometer.

Preparation of the Polyurethane Reactive Mixture and Coating Procedure

Preparation of Polyol with Catalyst—In a standard mixer equipped with low shear blade was placed 200 lbs of K-FLEX 188 and 42 grams of DABCO T-12. The components were mixed under vacuum for 4 hours at 70° C. and 28 inches of mercury to eliminate dissolved gases in the resin. The resulting resin was placed into 5 gallon pails for later use.

Preparation of DESMODUR N3300—In a standard mixer equipped with low shear blade was placed 200 lbs of DESMODUR N330. The component was mixed under vacuum for 4 hours at 140° F. and 28 inches of mercury to eliminate dissolved gases in the resin. The resulting resin was placed into 5 gallon pails for later use.

Preparation of Examples 1-5

The Polyol with catalyst and DESMODUR N3300 were added to separate pumps carts with mass flow controllers. The Polyol with catalyst was heated to 60° C. to lower the viscosity. The two components were delivered in controlled stoichiometry from the pump carts via mass flow control to a Kenics static mixer (355 mm long, with 32 elements). The polyurethane reactive mixture was placed between 12" wide T-50 liners and the films were pulled under a notch bar with a gap set to produce a polyurethane coating with the ~3 mil thickness in a continuous fashion. The assembly was heated at elevated temperature on hot platens to gel the polyurethane film and was placed into a 70° C. oven for 16 hours to cure. Prior to testing, both the liners were removed.

Example 6—Polyurethane on LmPEN

The Polyol with catalyst and DESMODUR N3300 were added to separate pumps carts with mass flow controllers. The Polyol with catalyst was heated to 60 degrees C. to lower the viscosity. The two components were delivered in controlled stoichiometry from the pump carts via mass flow control to a Kenics static mixer (355 mm long, with 32 elements). The 2-part polyurethane reactive mixture was coated between a 12" COP liner and the primed LmPEN film described above. The reactive mixture was placed polyurethane coatings of the desired thickness between the films in a continuous fashion. The assembly was heated at elevated temperature on hot platens to gel the polyurethane film and was placed into a 70 degrees C. oven for 16 hours to cure. Prior to testing, the COP liner was removed.

The crosslink density of the cured polyurethane coatings was calculated using the method described in *Macromolecules*, Vol. 9, No. 2, pages 206-211 (1976). To implement this model, integral values for chemical functionality are required. DESMODUR N3300 is reported to have an average functionality of 3.5 and an isocyanate equivalent weight of 193 g/equiv. This material was represented in the mathematical model as a mixture of 47.5 wt % HDI trimer (168.2 g/equiv.), 25.0 wt % HDI tetramer (210.2 g/equiv.), and 27.5 wt % of HDI pentamer (235.5 g/equiv.). This mixture yields an average equivalent weight of 193 g/equiv. and an average functionality of 3.5.

TABLE 3

Coating compositions and theoretical crosslink concentration

| Example | Polyol with catalyst pump set rate (g/min) | DESMODUR 3300 pump flow set rate (g/min) | NCO/OH Ratio | Theoretical Gel Content | Theoretical Crosslink Concentration (mol/kg) |
|---|---|---|---|---|---|
| 1 | 32.77 | 20.74 | 0.8 | 96.67% | 0.34 |
| 2 | 32.77 | 22.03 | 0.85 | 98.31% | 0.42 |
| 3 | 32.77 | 23.33 | 0.9 | 99.32% | 0.49 |
| 4 | 32.77 | 24.62 | 0.95 | 99.85% | 0.57 |
| 5 | 32.77 | 25.92 | 1 | 100% | 0.65 |
| 6 | 19.36 | 15.6 | 1.025 | 100% | 0.63 |

Example 7: Polyurethane on Upilex 50 S Substrate

In a Max 40 cup (Available from Flaktek, Inc.) at RT (23° C.) were mixed 12 grams of K-FLEX 188 and 1 drop of DABCO T-12 (from micro syringe). To the 12 grams of above resin mixture was mixed 10 grams of DESMODUR N3300A. The reactive mixture was mixed in a FlackTek, Inc. Speed Mixer at 1500 rpm for 30 seconds and used within 5 minutes of mixing in DESMODUR N3300A. The polyurethane reactive mixture was coated between a 12" wide 4 mil COP and a 50 micron corona treated (Sherman Treaters) Upilex 50S film. The reactive mixture was placed between the two films and the films were pulled under a notch bar with a gap set to produce a 2 mil (100 micron) polyurethane coating between the liners. The film was placed into a 70° C. oven for 16 hours to cure. The COP liner was removed prior to testing. The total thickness of the construction was measured as 107 μm.

Following the calculation methods as Examples 1-6, the NCO/OH ratio of the Example 7 coating is 1.02, theoretical gel content of the Polyurethane coating is 100%, and the crosslink density is 0.63 mol/kg, all approximately the same as Example 6.

Polyurethane Coating Characterization
Glass Transition Temperature

The glass transition temperature of the polyurethane coatings as a function of cross-link density was characterized using a TA Instruments Model Q2000 Differential Scanning calorimeter. The scans were taken at 2° C. per minute heating rate. For examples 1-5, an empty sample pan was used as a reference. For example 6, a piece of primed LmPEN film was placed in the reference pan. The results are shown in Table 4 below. The onset and mid-point of the glass transition were determined per ASTM E1356-08 (2014).

Dynamic Mechanical Analysis Test Method

Samples from examples 1-5 were cut into strips 6.35 mm wide and about 4 cm long. The thickness of each film was measured. The films were mounted in the tensile grips of a Q800 DMA from TA Instruments with an initial grip separation between 6 mm and 9 mm. The samples were then tested at an oscillation of 0.2% strain and 1 Hz throughout a temperature ramp from −20° C. to 200° C. at a rate of 2° C. per minute. The temperature at which the Tan Delta signal reached a maximum was recorded as the glass transition temperature.

TABLE 4

Thermal, mechanical, and optical properties of the coatings alone

| | 2nd Scan Glass Transition by DSC | | Dynamic Mechanical Analysis | | |
|---|---|---|---|---|---|
| | | | Storage Modulus @ | Peak | Temp at peak |
| Example | Onset ° C. | Midpoint (I) ° C. | °0 C. (GPa) | Tan Delta | Tan Delta (° C.) |
| 1 | 12.83 | 19.06 | 1.47 | 1.79 | 39.4 |
| 2 | 17.22 | 22.47 | 1.47 | 1.66 | 43.9 |
| 3 | 20.67 | 26.16 | 1.4 | 1.68 | 47.5 |
| 4 | 25.94 | 29.29 | 1.43 | 1.61 | 49.8 |
| 5 | 26.61 | 31.16 | 1.54 | 1.46 | 47.5 |
| 6 | 29.10 | 34.66 | NA | NA | NA |

Display Film Characterization Methods
Modulus and Yield Stress of the Substrate

Tensile properties were determined on an MTS Insight 5 System. The test specimens were dog bone shape (Type II in ASTM 638-14) cut from the films using a width of 3 mm with the thickness determined using a digital micrometer. Tests were run with a strain rate of 50.8 mm/min and gauge length (grip separation) of 25 mm using a 100N load cell. The 0.2% offset yield stress was determined from the stress strain curves following the procedures defined in section A2.6 of ASTM D638-14 "Standard Test Method for Tensile Properties of Plastics".

Instrumented Scratch Resistance Test

The scratch resistance of the coated substrates was characterized using a Revetest RST instrumented scratch tester (Anton Paar, USA) fitted with a 1 mm diameter, 100Cr6 stainless steel ball tip. A sample of each construction was clamped against a glass slide and then a series of 8 mm long scratches were made in the samples at constant normal load and a rate of 60 mm/min. The sample was then set aside to recover at 23±2° C. and 50±5% relative humidity. The highest normal load dent that was not visible to the naked eye after 24 hrs. recovery was recorded as the critical normal load (N).

Mandrel Bend Test

Bending properties of the coated substrates were tested using a modified version of ASTM Method D522/522M-13 "Mandrel Bend Test of Attached Organic Coatings", test method B, Cylindrical Mandrel Test. Instead of bending to 90 degrees as specified in the ASTM method, all the samples were wrapped 180 degrees around the mandrel and then evaluated for damage. All samples were tested with the coating(s) on the outside radius (i.e. the coatings are in tension). The minimum cylinder size where no cracking was observed was reported as the minimum bend radius (pass/fail basis).

Transmission, Haze, and Clarity

Optical properties of the prepared examples were measured using a Hazegard instrument. Luminous transmission, clarity, and haze were measured according to ASTM D1003-00 using a Gardner Haze-Guard Plus model 4725 (available from BYK-Gardner Columbia, Md.). Each result in Table 6 is the average of three measurements on a given sample.

Results

TABLE 5

Summary of Experimental Results

| Example | Tensile Properties of Polymer Substrate | | Overall Thickness including coating (um) | Critical Load for 24 hr. Room Temperature Scratch Recovery (N) | Mandrel Bend Radius (mm) |
|---|---|---|---|---|---|
| | Modulus (GPa) | 0.2% Offset Yield Stress (MPa) | | | |
| 6 | 4.7 | 84 | 125 | 10 | 2 |
| 7 | 8.0 | 227 | 107 | 12.5 | 2 |

TABLE 6

Optical properties of Example 6

| Example | Transmission | Haze (%) | Clarity % |
|---|---|---|---|
| 6 | 91.0 | 0.28 | 100 |

Table 5 shows that despite being slightly thinner, the Example 7 with the high yield stress substrate showed higher critical normal load than the Example 6. This increase in performance is achieved even though the thickness of the shape memory layer is thinner by ~20 microns. Table 5 illustrates that both films can be bent around a radius of 2 mm without the coating sustaining damage such as cracking or delamination or development of visible haze.

Thus, embodiments of THIN PROTECTIVE DISPLAY FILMS are disclosed.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof. The disclosed embodiments are presented for purposes of illustration and not limitation.

What is claimed is:

1. A display film comprising:
   a transparent polymeric substrate layer having a 0.2% offset yield stress greater than 110 MPa;
   a transparent aliphatic cross-linked polyurethane layer having a glass transition temperature in a range from 11 to 27 degrees Celsius, a cross-link density in a range from 0.34 to 0.65 mol/kg, and a thickness in a range of 10 μm to 100 μm, and comprising aliphatic cross-linked polyurethane prepared by step-growth polymerization of polyol with an isocyanate-functional material; and
   a hardcoat layer disposed on the transparent polymeric substrate layer or between the transparent polymeric substrate layer and the transparent aliphatic cross-linked polyurethane layer,
   wherein the display film is transparent in a wavelength range of 380 nm to 700 nm.

2. The display film according to claim 1, wherein the display film has a thickness of less than 200 micrometers and the transparent polymeric substrate layer has a 0.2% offset yield stress greater than 130 MPa.

3. The display film according to claim 1, wherein the transparent aliphatic cross-linked polyurethane layer has a Tan Delta peak value in a range from 0.5 to 2.5.

4. The display film according to claim 1, wherein the transparent aliphatic cross-linked polyurethane layer has a glass transition temperature in a range from 17 to 22 degrees Celsius and a Tan Delta peak value in a range from 1 to 2.

5. The display film according to claim 1, wherein the display film has a haze of 2% or less.

6. The display film according to claim 1, wherein the hardcoat layer is disposed on a first side of the transparent polymeric substrate layer and the transparent aliphatic cross-linked polyurethane layer is disposed on a second side of the transparent polymeric substrate layer opposite of the first side.

7. The display film according to claim 1, wherein the hardcoat layer is disposed between the transparent polymeric substrate layer and the transparent aliphatic cross-linked polyurethane layer.

8. The display film according to claim 1, wherein the hardcoat layer comprises multi-functional acrylate resin.

9. The display film according to claim 1, wherein the hardcoat layer comprises nanosilica particles.

10. The display film according to claim 1, further comprising a removable liner disposed on the transparent polymeric substrate layer or the transparent aliphatic cross-linked polyurethane layer.

11. The display film according to claim 1, further comprising an optical adhesive layer disposed on the transparent polymeric substrate layer and a removable liner disposed on the optical adhesive layer.

12. The display film according to claim 1, wherein the transparent polymeric substrate comprises polyimide.

13. The display film according to claim 12, wherein the display film has a yellow color value b* of 5 or less.

14. An article comprising:
an optical display;
a transparent protective film disposed on the optical display, the protective film comprising:
　a transparent polymeric substrate layer;
　a transparent aliphatic cross-linked polyurethane layer disposed on the transparent polymeric substrate layer and having a glass transition temperature in a range from 11 to 27 degrees Celsius, a cross-link density in a range from 0.34 to 0.65 mol/kg, and a thickness in a range of 20 µm to 100 µm, and comprising aliphatic cross-linked polyurethane prepared by step-growth polymerization of polyol with an isocyanate-functional material; and
　a hardcoat layer disposed on the transparent polymeric substrate layer or the transparent aliphatic cross-linked polyurethane layer; and
an optical adhesive layer fixing the protective film to the optical display,
wherein the optical display and the protective film are foldable so that the optical display faces itself and at least a portion of the protective film overlaps another portion of the protective film, and
wherein the protective film is transparent from wavelength 380 nm to 700 nm.

15. The article according to claim 14, wherein the optical display comprises an OLED display panel, an LCD panel, or a reflective display.

16. The article according to claim 14, wherein the transparent polymeric substrate layer has a 0.2% offset yield stress greater than 110 MPa.

17. The article according to claim 14, wherein the transparent protective film has a haze of 2% or less.

* * * * *